(12) United States Patent
King

(10) Patent No.: US 8,094,047 B2
(45) Date of Patent: Jan. 10, 2012

(54) DATA SERIALIZER APPARATUS AND METHODS

(75) Inventor: Greg King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 12/556,750

(22) Filed: Sep. 10, 2009

(65) Prior Publication Data

US 2011/0057820 A1    Mar. 10, 2011

(51) Int. Cl.
*H03M 9/00* (2006.01)
(52) U.S. Cl. .................. 341/101; 341/100; 327/408
(58) Field of Classification Search .................. 341/100, 341/101; 327/407, 408, 411
See application file for complete search history.

(56) References Cited

U.S. PATENT DOCUMENTS

| | | | | |
|---|---|---|---|---|
| 5,805,089 A | * | 9/1998 | Fiedler et al. | 341/101 |
| 7,327,814 B1 | * | 2/2008 | Xu | 375/350 |
| 7,355,449 B1 | * | 4/2008 | Tran et al. | 326/82 |
| 7,460,039 B2 | * | 12/2008 | Jeon | 341/100 |
| 7,602,818 B2 | * | 10/2009 | Dao et al. | 370/535 |
| 7,848,318 B2 | * | 12/2010 | Nguyen et al. | 370/366 |
| 2007/0063739 A1 | * | 3/2007 | Kim | 326/83 |

* cited by examiner

*Primary Examiner* — Howard Williams
(74) *Attorney, Agent, or Firm* — Schwegman, Lundberg & Woessner, P.A.

(57) ABSTRACT

Some embodiments include apparatus and methods having an output line, clock nodes to receive clock signals, the clock signals being out of phase with each other, and selector circuits to receive data in parallel. In at least one embodiment, the selector circuits are responsive to the clock signals to transfer the data serially to the output line. Such apparatus and methods can also include a control unit to influence a portion of a signal that represents at least a portion of the data at the output line. Additional apparatus and methods are described.

25 Claims, 7 Drawing Sheets

US 8,094,047 B2

DATA SERIALIZER APPARATUS AND METHODS

BACKGROUND

Many computers and other electronic products have data serializer circuits and use them to transfer data between devices. The devices can be located within the same product or between different products. Data serializer circuits often receive data in parallel (concurrently) from one device and then transfer the data serially to another device.

DETAILED DESCRIPTION

Figure 1:
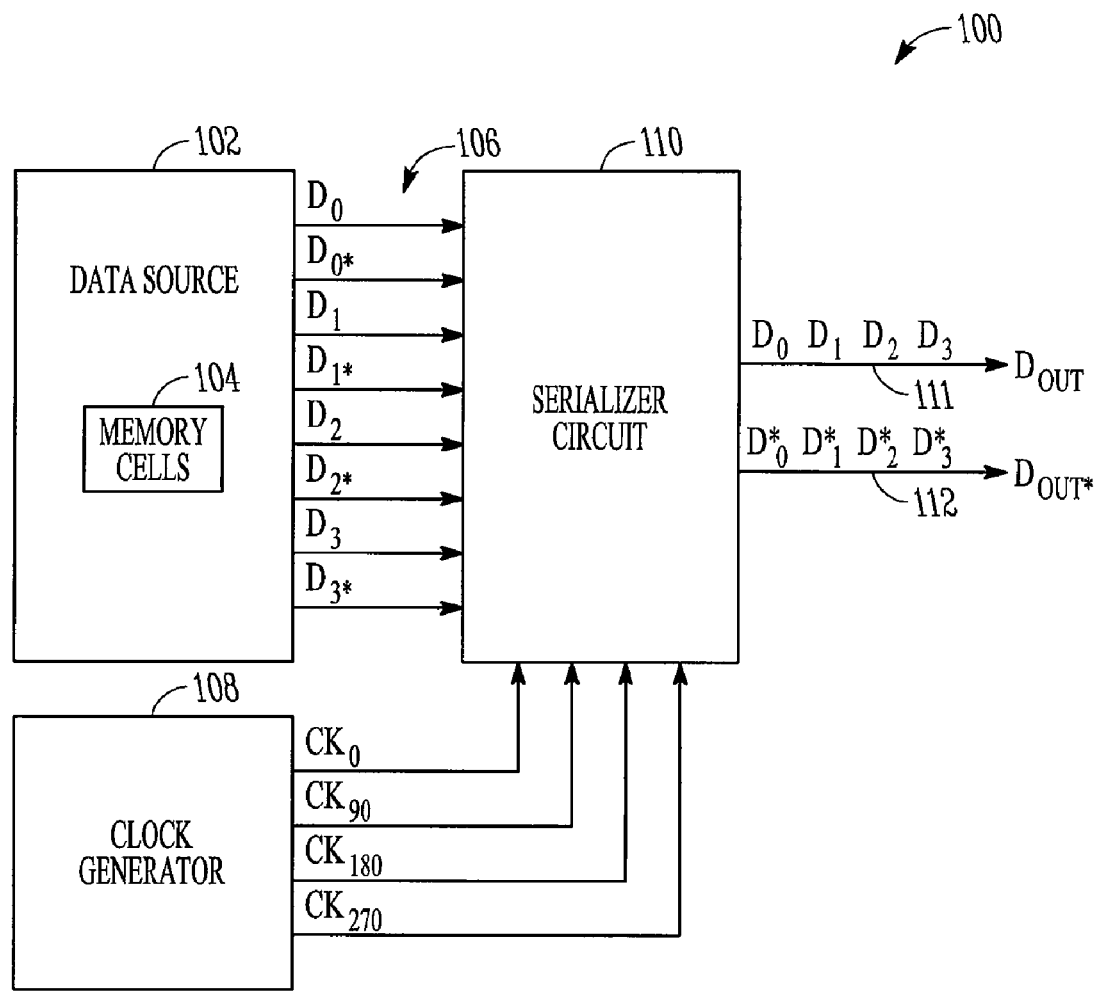
FIG. 1 shows a block diagram of an integrated circuit (IC) device including a serializer circuit, according to an example embodiment of the invention.

FIG. 1 shows a block diagram of an IC device 100 including a serializer circuit 110, according to an example embodiment. IC device 100 can be a semiconductor device, such as a processor, a memory controller, a memory device, or other device. IC device 100 includes a data source 102 to provide data $D_0$, $D_0^*$, $D_1$, $D_1^*$, $D_2$, $D_2^*$, $D_3$, and $D_3^*$, which can be stored in memory cells 104. Data $D_0$, $D_0^*$, $D_1$, $D_1^*$, $D_2$, $D_2^*$, $D_3$, and $D_3^*$ can be generated internally by IC device 100 device or can be provided to IC device 100 by another device. The data are transferred in parallel on lines 106.

The data can include true and complementary data (e.g., differential data). For example, $D_0$ and $D_0^*$ can be a first data where $D_0$ represents a true form (e.g., presenting logic 1 value) of the first data and $D_0^*$ represents a complementary form (e.g., presenting logic 0 value) of the first data or vice versa. Similar, $D_1$ and $D_1^*$ can be a second data where $D_1$ represents a true form of the second data and $D_1^*$ represents a complementary form of the second data. $D_2$ and $D_2^*$ can be a third data where $D_2$ represents a true form of the third data and $D_2^*$ represents a complementary form of the second data. $D_3$ and $D_3^*$ can be a fourth data where $D_3$ represents a true form of the fourth data and $D_3^*$ represents a complementary of the fourth data. Thus, data $D_i$ and $D_i^*$ are complements of each other, where i=0, 1, 2, or 3 as shown in the examples of data $D_0$, $D_0^*$, $D_1$, $D_1^*$, $D_2$, $D_2^*$, $D_3$, and $D_3^*$.

IC device 100 also includes a clock generator 108 to generate clock signals $CK_0$, $CK_{90}$, $CK_{180}$, and $CK_{270}$ with various phase differences among them. For example, the phase differences include a phase difference of 90 degrees between clock signals $CK_0$ and $CK_{90}$; a phase difference of 90 degrees between clock signals $CK_{90}$ and $CK_{180}$; a phase difference of 90 degrees between clock signals $CK_{180}$ and $CK_{270}$; and a phase difference of 90 degrees between clock signals $CK_{270}$ and $CK_0$. A phase difference of 90 degrees between two clock signals (e.g., between $CK_0$ and $CK_{90}$) means that the two clock signals are 90 degrees out of phase with each other.

Serializer circuit 110 responds to clock signals $CK_0$, $CK_{90}$, $CK_{180}$, and $CK_{270}$ to provide data $D_{OUT}$ on line (e.g., output line) 111 and data $D_{OUT}^*$ on line 112. Serializer circuit 110 receives the data on lines 106 in parallel from data source 102 and transfers the data serially to lines 111 and 112 as data $D_{OUT}$ and $D_{OUT}^*$. As shown in FIG. 1, data $D_{OUT}$ includes $D_0$, $D_1$, $D_2$, and $D_3$ serially provided on the same line 111. Data $D_{OUT}^*$ includes $D_0^*$, $D_1^*$, $D_2^*$, and $D_3^*$ serially provided on the same line 112. Serializer circuit 110 includes embodiments of the serializer circuits described below with reference to FIG. 2 through FIG. 7.

Figure 2:
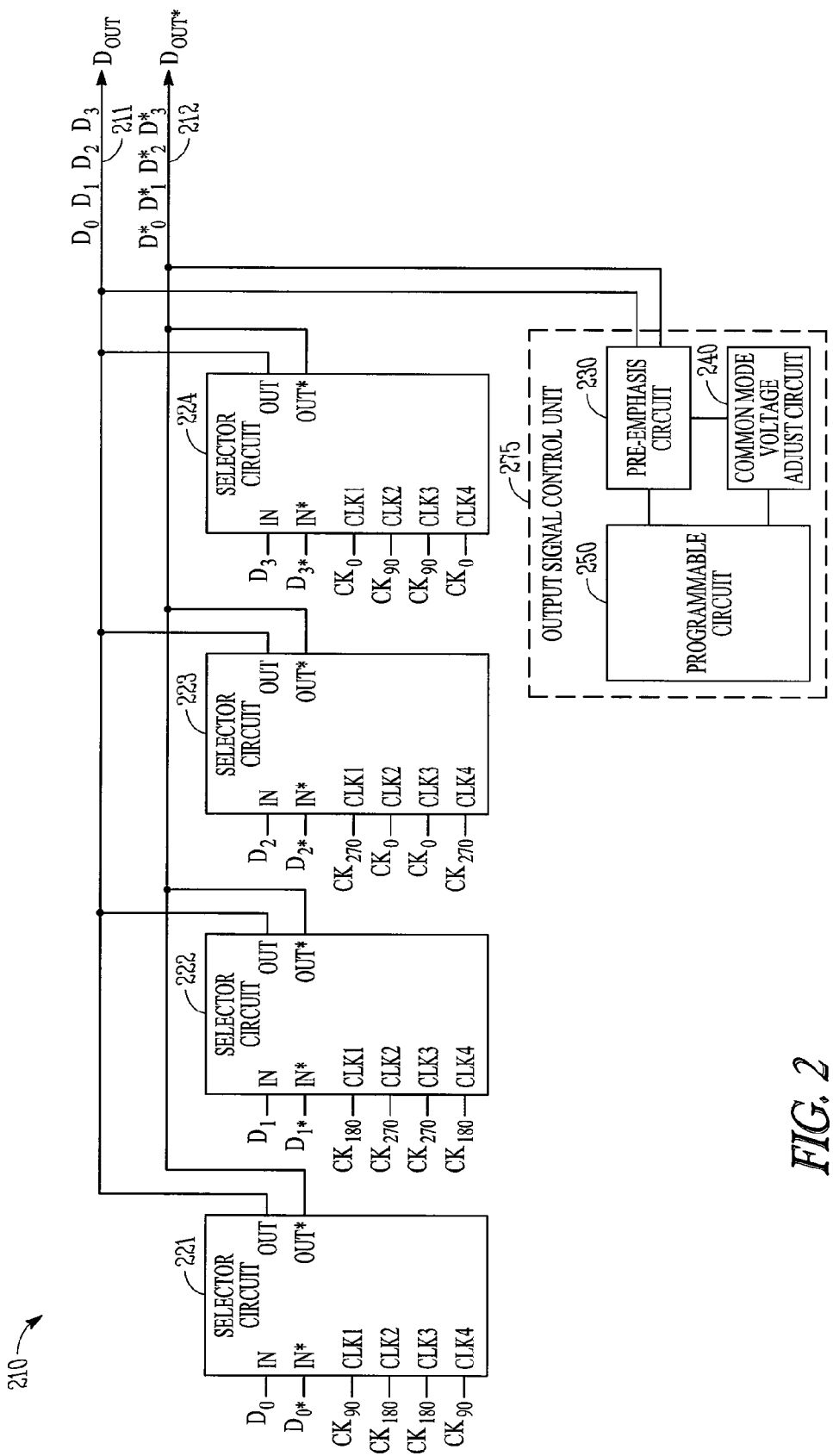
FIG. 2 shows a block diagram of a serializer circuit, according to an example embodiment of the invention.

FIG. 2 shows a block diagram of a serializer circuit 210, according to an example embodiment. Serializer circuit 210 includes selector circuits 221, 222, 223, and 234, each having input node IN and IN*, output nodes OUT and OUT*, and clock nodes CLK1, CLK2, CLK3, and CKL4. Serializer circuit 210 receives data $D_0$, $D_0^*$, $D_1$, $D_1^*$, $D_2$, $D_2^*$, $D_3$, and $D_3^*$ in parallel at input node IN and IN* of selector circuits 221, 222, 223, and 234. Serializer circuit 210 responds to clock signals $CK_0$, $CK_{90}$, $CK_{180}$, and $CK_{270}$ to serially transfer data $D_0$, $D_0^*$, $D_1$, $D_1^*$, $D_2$, $D_2^*$, $D_3$, and $D_3^*$ from input nodes IN and IN* of selector circuits 221, 222, 223, and 224 to lines (e.g., output lines) 211 and 212.

Serializer circuit 210 also includes an output signal control unit 275, which can be used to influence at least a portion of a signal that represents at least a portion of the data at the output line. According to one or more embodiments, output signal control unit 275 can include a pre-emphasis circuit 230, or a common mode voltage adjust circuit 240, or both pre-emphasis circuit 230 and common mode voltage adjust circuit 240. Manufacturing process and operating condition variations may degrade signals on lines 211 and 212. Pre-emphasis circuit 230 allows output signal control unit 275 to provide additional drive capability on lines 211 and 212 to compensate for process and operating condition variations or other sources of signal attenuation.

Different device applications can have different common mode operating points, such as different magnitudes (e.g., different signal levels) to represent different values (e.g., logic 1 and 0) of data on lines 211 and 212. Common mode voltage adjust circuit 240 allows output signal control unit 275 to adjust the magnitude of signals on lines 211 and 212.

Pre-emphasis circuit 230 and common mode voltage adjust circuit 240 can include selectable components (not shown) that can be set to values that suit an application of a device (e.g. IC device 100 of FIG. 1) that includes serializer circuit 210. Examples of the selectable components include transistors and transmission gates that can be selectively turned on and off.

Output signal control unit 275 also includes a programmable circuit 250 having programmable components (not shown) that can be programmed to provide appropriate control information (e.g., control signals) to pre-emphasis circuit 230 and common mode voltage adjust circuit 240. For example, programmable circuit 250 can include programmable components, such as fuses, antifuses, memory cells, or other programmable components. Based on a device application, the programmable components of programmable circuit 250 can be programmed to provide appropriate control signals to set values in selectable components of pre-emphasis circuit 230 and common mode voltage adjust circuit 240.

As shown in FIG. 2, each of selector circuits 221, 222, 223, and 224 receives a different combination of clock signals $CK_0$, $CK_{90}$, $CK_{180}$, and $CK_{270}$. For example, selector circuit 221 receives a combination of clock signals $CK_{90}$ and $CK_{180}$. Selector circuit 222 receives a combination of clock signals $CK_{180}$ and $CK_{270}$. Selector circuit 223 receives a combination of clock signals $CK_0$ and $CK_{270}$. Selector circuit 224 receives a combination of clock signals $CK_0$ and $CK_{90}$.

Clock signals $CK_0$, $CK_{90}$, $CK_{180}$, and $CK_{270}$ have different phases. Thus, each of selector circuits 221, 222, 223, and 234 receives a different phase combination of clock signals $CK_0$, $CK_{90}$, $CK_{180}$, and $CK_{270}$ to transfer data to lines 211 and 212.

Figure 3:
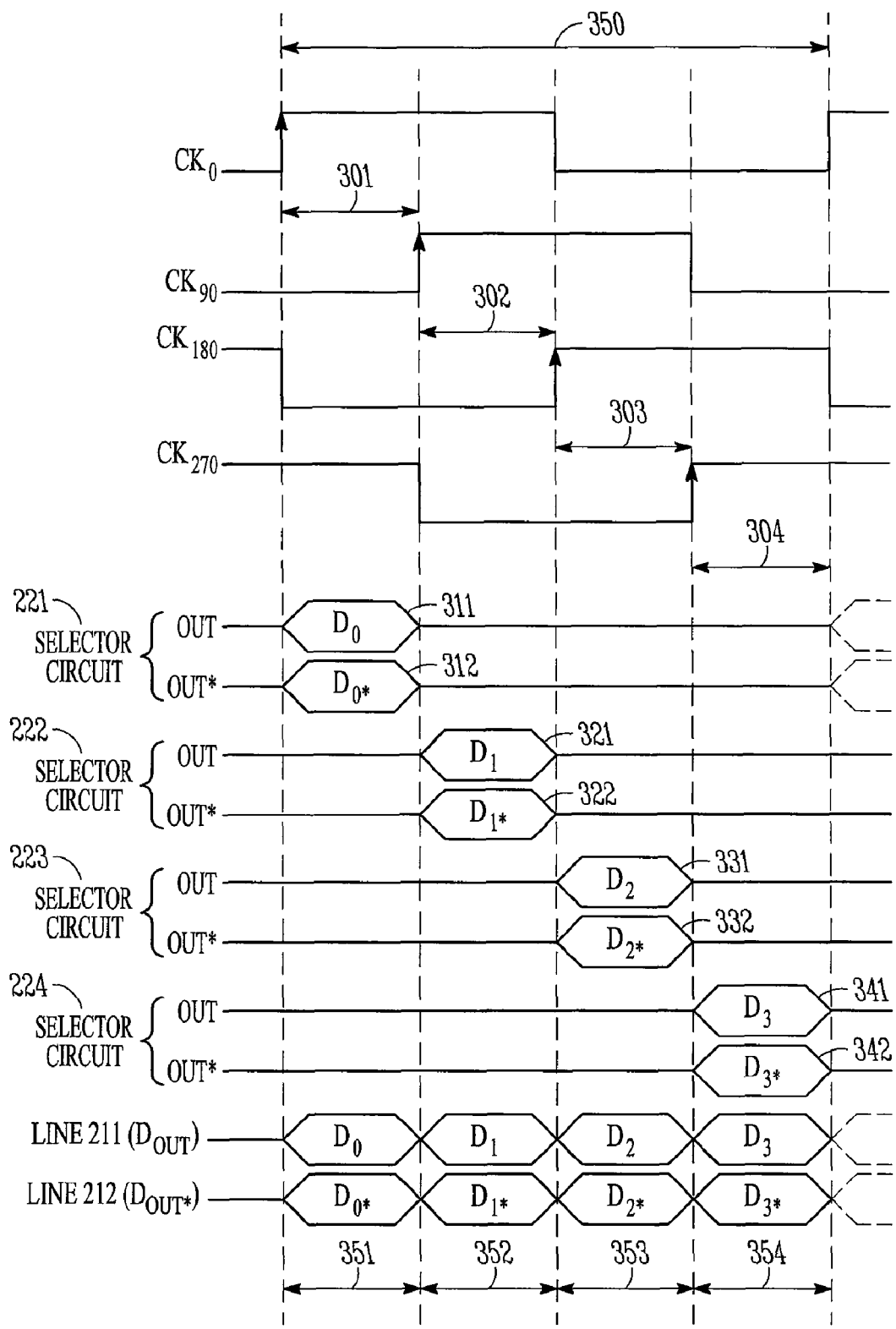
FIG. 3 shows a timing diagram for clock signals and data of the serializer circuit of FIG. 2, according to an example embodiment of the invention.

FIG. 3 shows a timing diagram for clock signals $CK_0$, $CK_{90}$, $CK_{180}$, and $CK_{270}$ and data of serializer circuit 210 of FIG. 2, according to an example embodiment. As shown in FIG. 3, clock signals $CK_0$, $CK_{90}$, $CK_{180}$, and $CK_{270}$ have the same clock period, such as clock period 350, but they are out of phase with each other, resulting in various phase differences among them. For example, clock signals $CK_0$, $CK_{90}$, $CK_{180}$, and $CK_{270}$ have four phase differences: a phase difference 301 of 90 degrees between clock signals $CK_0$ and $CK_{90}$, a phase difference 302 of 90 degrees between clock signals $CK_{90}$ and $CK_{180}$, a phase difference 303 of 90 degrees between clock signals $CK_{180}$ and $CK_{270}$, and a phase difference 304 of 90 degrees between clock signals $CK_{270}$ and $CK_0$. The following description refers to FIG. 2 and FIG. 3.

Serializer circuit 210 of FIG. 2 transfers data $D_0$, $D_0^*$, $D_1$, $D_1^*$, $D_2$, $D_2^*$, $D_3$, and $D_3^*$ to lines 211 and 212 during four equal time intervals 351, 352, 353, and 354. Each of these times intervals is equal to one-fourth of clock period 350 of clock signal $CK_0$. Each of time intervals 351, 352, 353, and 354 corresponds to the transfer rate that serializer circuit 210 uses to transfer data to lines 211 and 212. For example, if the transfer rate is 10 giga bits per second (10 Gb/s), then each of time intervals 351, 352, 353, and 354 is equal to 100 pico seconds (100 ps).

As show in FIG. 3, during a different time interval of the four time intervals 351, 352, 353, and 354, each of selector circuits 221, 222, 223, and 224 provides two bits of data: one bit of data (e.g., true data bit) on its output node OUT and another bit of data (e.g., complementary data bit) on its output node OUT*. For example, during time interval 351, selector circuit 221 provides two bits 311 and 312 of data $D_0$ on its output nodes OUT and OUT*, respectively. Bits 311 and 312 are complementary bits. For example, when bit 311 has a logic 1 value, bit 312 has a logic 0 value. When bit 311 has a logic 0 value, bit 312 has a logic 0 one. During time interval 352, selector circuit 222 provides two complementary bits 321 and 322 of data $D_1$ on its output nodes OUT and OUT*, respectively. During time interval 353, selector circuit 222 provides two complementary bits 331 and 332 of data $D_2$ on its output nodes OUT and OUT*, respectively. During time interval 354, selector circuit 222 provides two complementary bits 341 and 342 of data $D_3$ on its output nodes OUT and OUT*, respectively.

During each of time intervals 351, 352, 353, and 354, serializer circuit 210 respectively transfers the bits of data from output nodes OUT and OUT* of one of selector circuits 221, 222, 223, and 224 to lines 211 and 212. Thus, in four time intervals 351, 352, 353, and 354, serializer circuit 210 serially provides four bits of data $D_0$, $D_1$, $D_2$, and $D_3$ on line 211 and serially provides four bits of data $D_0^*$, $D_1^*$, $D_2^*$, and $D_3^*$ on line 212.

Figure 4:
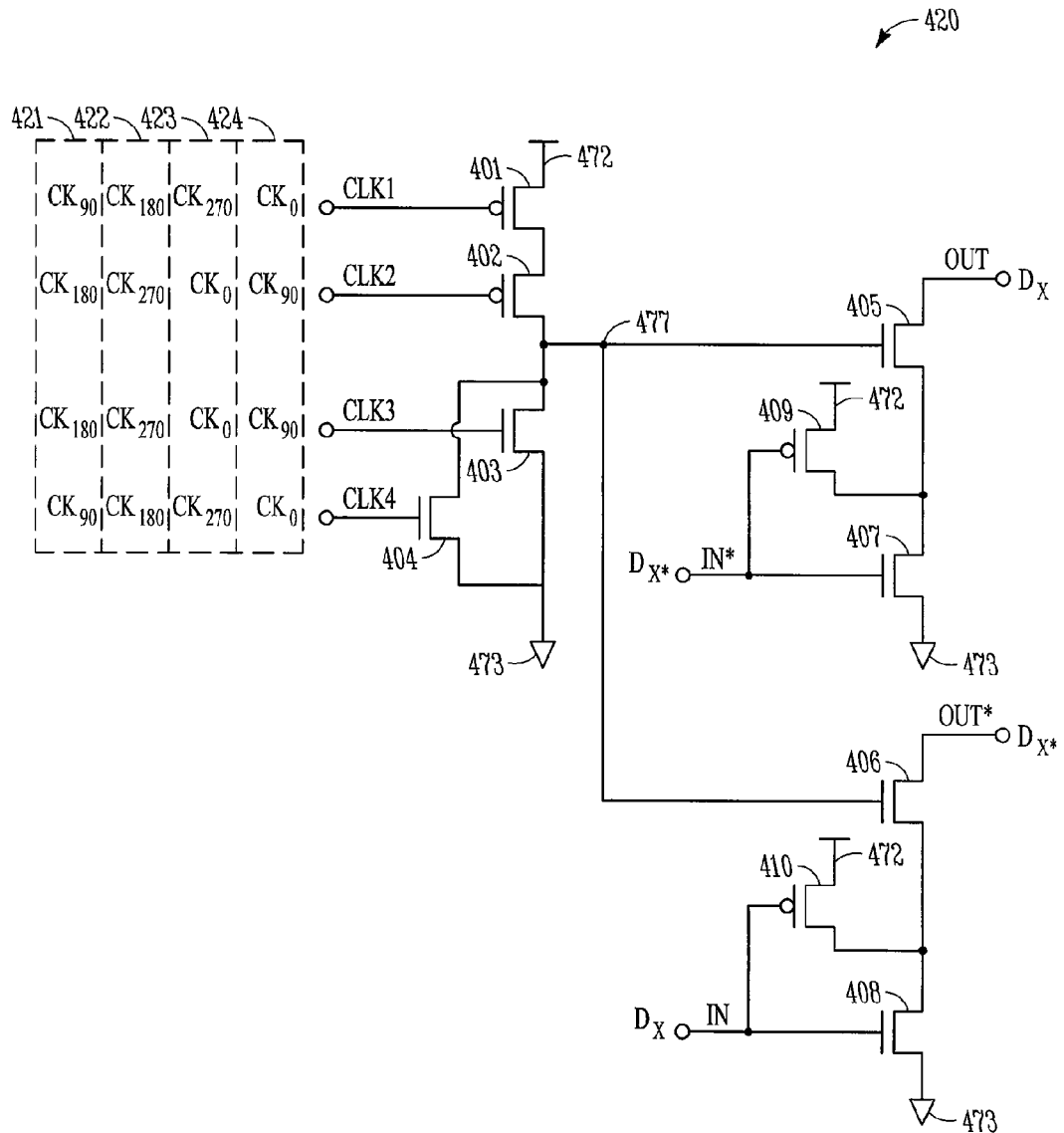
FIG. 4 shows a schematic diagram of a selector circuit, according to an example embodiment of the invention.

FIG. 4 shows a schematic diagram of a selector circuit 420, according to an example embodiment. Selector circuit 420 can be used for each of selector circuits 221, 222, 223, and 224 of FIG. 2. In FIG. 4, combinations 421, 422, 423, and 424 of clock signals $CK_0$, $CK_{90}$, $CK_{180}$, and $CK_{270}$ respectively correspond to the same combinations of the clock signals received at selector circuits 221, 222, 223, and 224 of FIG. 2. Data $D_X$ and $D_X^*$ in FIG. 4 correspond to data $D_0$ and $D_0^*$, data $D_1$ and $D_1^*$, data $D_2$ and $D_2^*$, or data $D_3$ and $D_3^*$ of FIG. 2.

Selector circuit 420 includes clock nodes CLK1, CLK2, CLK3, and CLK4, input nodes IN and IN*, and output nodes OUT and OUT*, which can be coupled to output lines such as lines 211 and 212 of FIG. 2. As shown in FIG. 4, selector circuit 420 also includes p-channel metal-oxide semiconductor (PMOS) transistors 401, 402, 409, 410 and n-channel metal-oxide semiconductor (NMOS) transistors 403, 404, 405, 406, 407, and 408.

Transistors 407 and 409 form an inverter that has an inverter input node coupled to input node IN* to receive data $D_X^*$ and an inverter output node coupled to output node OUT through transistor 405. Transistors 408 and 410 form an inverter that has an inverter input node coupled input node IN to receive data $D_X$ and an inverter output node coupled to output node OUT* through transistor 406. Transistors 405 and 406 turn on to transfer data $D_X$ and $D_X^*$ to output nodes OUT* and OUT, respectively, when both transistors 401 and 402 turn on.

In operation, when the clock signals at both clock nodes CK1 and CK2 have the same value (e.g., zero volts, or "low"), both transistors 401 and 402 turn on, electrically coupling circuit node 477 to supply node 472 and enabling selector circuit 420 by turning on both transistors 405 and 406. Data $D_X$ and $D_X^*$ are transferred from input nodes IN and IN* to output node OUT* and OUT, respectively, as described in detail below. When the clock signals at clock nodes CK1 and CK2 have different values, at least one of transistors 401 and 402 turns off, thereby disabling selector circuit 420 and stopping the transfer of data from input nodes IN and IN* to output node OUT and OUT*.

When selector circuit 420 is enabled, if a bit of data $D_X^*$ has a first value (e.g., logic 0), transistor 407 turns off, transistor 409 turns on and forms a circuit path to electrically couple output node OUT (and line such as line 211 of FIG. 2) to supply node 472. If the bit of data $D_X^*$ has a second value (e.g., logic 1), transistor 409 turns off, transistor 407 turns on and forms a circuit path to electrically couple output node OUT to supply node 473. Supply node 472 can have a voltage value corresponding to a supply voltage (e.g., VDD or some positive value) that selector circuit 420 uses to operate. Supply node 473 can have a voltage value of zero volts or a value corresponding to another supply voltage (e.g., Vss or a negative value) that selector circuit 420 uses to operate.

When selector circuit 420 is enabled, if a bit of data $D_X$ has a first value (e.g., logic 0), transistor 408 turns off, transistor 410 turns on and forms a circuit path to electrically couple output node OUT* (and a line, such as line 212 of FIG. 2) to supply node 472. If the bit of data $D_X$ has a second value (e.g., logic 1), transistor 410 turns off, transistor 408 turns on and forms a circuit path to electrically couple output node OUT* to supply node 473.

As described above, data $D_X$ and $D_X^*$ correspond to data $D_0$ and $D_0^*$, data $D_1$ and $D_1^*$, data $D_2$ and $D_2^*$, or data $D_3$ and $D_3^*$ of FIG. 2. Thus, the bits of data $D_X$ and $D_X^*$ have complementary values. Therefore, when selector circuit 420 is enabled, output nodes OUT and OUT* have complementary values corresponding to complementary values of $D_X^*$ and $D_X$, respectively, received at input nodes IN* and IN. If selector circuit 420 is used for each of selector circuits 221, 222, 223, and 224 of FIG. 2, the operation of selector circuit 420 can be enabled to transfer data $D_X$ and $D_X^*$ from input nodes IN and IN* to output node OUT and OUT* as follows.

If selector circuit 420 is used for selector circuit 221, combination 421 in FIG. 4 is applied to clock nodes CLK1, CLK2, CLK3, and CLK4, selector circuit 420 is enabled during time interval 301 of FIG. 3 to transfer data from input nodes IN and IN* to output node OUT and OUT*. Selector circuit 420 is disabled during time intervals 302, 303, and 304.

If selector circuit 420 is used for selector circuit 222 of FIG. 2, combination 422 in FIG. 4 is applied to clock nodes CLK1, CLK2, CLK3, and CLK4, selector circuit 420 is enabled during time interval 302 of FIG. 3 to transfer data from input nodes IN and IN* to output node OUT and OUT*. Selector circuit 420 is disabled during time intervals 301, 303, and 304.

If selector circuit 420 is used for selector circuit 223 of FIG. 2, combination 423 in FIG. 4 is applied to clock nodes CLK1, CLK2, CLK3, and CLK4, selector circuit 420 is enabled during time interval 303 of FIG. 3 to transfer data from input nodes IN and IN* to output node OUT and OUT*. Selector circuit 420 is disabled during time intervals 301, 302, and 304.

If selector circuit 420 is used for selector circuit 224 of FIG. 2, combination 424 in FIG. 4 is applied to clock nodes CLK1, CLK2, CLK3, and CLK4, selector circuit 420 is enabled during time interval 304 of FIG. 3 to transfer data from input nodes IN and IN* to output node OUT and OUT*. Selector circuit 420 is disabled during time intervals 301, 302, and 303.

Figure 5:
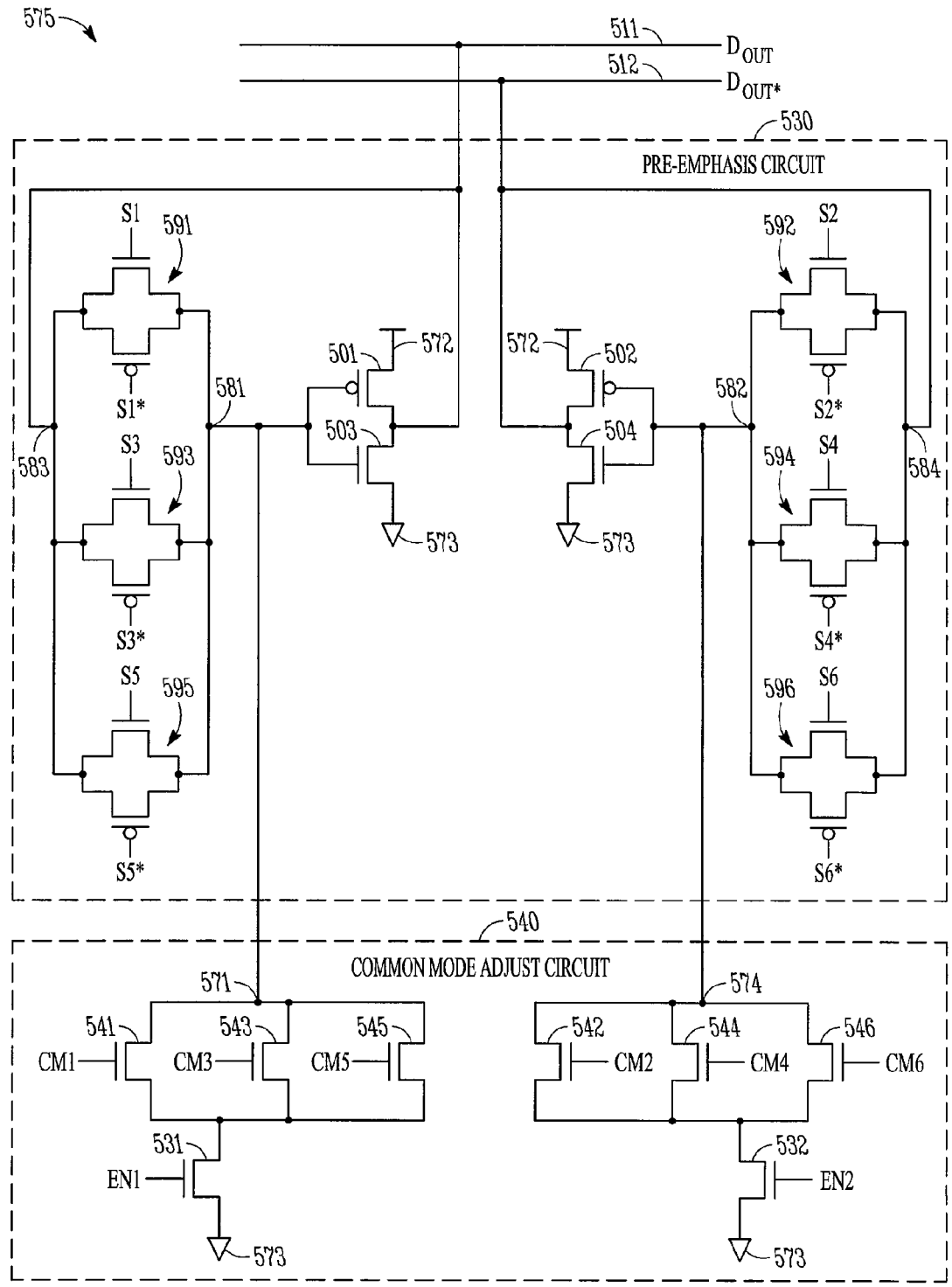
FIG. 5 shows a schematic diagram of an output signal control unit, according to an example embodiment of the invention.

FIG. 5 shows a schematic diagram of an output signal control unit 575, according to an example embodiment. Output signal control unit 575 can be used for output signal control unit 275 of FIG. 2. In FIG. 5, the signals on lines (e.g., output lines) 511 and 512 represent data $D_{OUT}$ and $D_{OUT}^*$, which correspond to data $D_{OUT}$ and $D_{OUT}^*$ of FIG. 2. Output signal control unit 575 of FIG. 5 includes a pre-emphasis circuit 530 and a common mode voltage adjust circuit 540 that have functions similar to pre-emphasis circuit 230 and common mode voltage adjust circuit 240 of FIG. 2.

In FIG. 5, pre-emphasis circuit 530 includes transistors 501 and 503 and an example number of three parallel transmission gates 591, 592, and 593 coupled between nodes 581 and 583. The number of transmission gates coupled in parallel between nodes 581 and 583 can vary. The resistance between nodes 581 and 583 through transmission gates 591, 593, and 595 and the capacitance on line 511 form an RC network. The RC network operates to cause a delay in switching (turning) on and off of transistor 501. This delay creates an additional current when the signal on line 511 changes from a lower level to a higher level in response to data (e.g., $D_0$, $D_1$, $D_2$, or $D_3$) being transferred to the line. The additional current provides a pre-emphasis on a portion of the signal on line 511. The description below with reference to FIG. 6 describes more details of examples of a pre-emphasis on a portion of the signal on line 511. In FIG. 5, a pre-emphasis portion has a value that can be selected by setting a resistance value of the RC network, which is a resistance value between nodes 581 and 583.

Transmission gates 591, 593, and 595 can be selectively turned on to set a resistance value between nodes 581 and 583. Complementary signal pairs S1 and S1*, S3 and S3*, and S5 and S5* can be used to selectively turn on transmission gates 591, 593, and 595. A programmable circuit, such as programmable circuit 250 of FIG. 2, can provide signals S1, S1*, S2, S2*, S3, S3*, S4, S4*, S5, S5*, S6, and S6*. The resistance value between nodes 581 and 583 is inversely proportional to the number transmission gates 591, 593, and 595 that turn on. Thus, a higher of number of transmission gates 591, 593, and 595 turning on provides a lower resistance value between nodes 581 and 583. A lower number of transmission gates 591, 593, and 595 turning on provides a higher resistance value between nodes 581 and 583. The value of a pre-emphasis portion (shown in detail in FIG. 6) of the signal on line 511 depends on the resistance value between nodes 581 and 583. A higher resistance between nodes 581 and 583 increases the charging time of the RC network, thereby producing more current on line 511. A lower resistance between nodes 581 and 583 decreases the charging time of the RC network, thereby producing less current on line 511.

In operation, when the signal on line 511 changes from a lower level to a higher level in response to data (e.g., $D_0$, $D_1$, $D_2$, or $D_3$) being transferred to line, the voltage at the gates of transistors 501 and 503 changes from a lower level to a higher level. Transistors 501 and 503 form an inverter coupled to supply nodes 572 and 573, which can correspond to supply nodes 472 and 473 of FIG. 4. In FIG. 5, when the signal on line 511 is at a lower level, transistor 501 turns on and forms a circuit path to electrically couple line 511 to supply node 572 through transistor 501. Thus, in operation, line 511 can be electrically coupled to supply node 572 through two different circuit paths: one circuit path through a transistor such as transistor 409 of FIG. 4 and another circuit path through transistor 501 of FIG. 5. When the signal on line 511 reaches a value below a threshold voltage value of transistor 501, transistor 501 turns off and disables the circuit path formed by transistor 501 from line 511 to supply node 572, thereby electrically decoupling line 511 from supply node 572.

Pre-emphasis circuit 530 also includes transistors 502 and 504 and an example number of three parallel transmission gates 592, 594, and 596 coupled between nodes 582 and 584. The number of transmission gates coupled in parallel between nodes 582 and 584 can vary. Transistors 502 and 504 and transmission gates 592, 594, and 596 perform functions to provide a pre-emphasis to the signal on line 512 in ways similar to the functions of transistor 501 and 503 and transmission gates 591, 592, and 593 providing the pre-emphasis to the signal on line 511. For example, the resistance between nodes 582 and 584 through transmission gates 592, 594, and 596 and the capacitance on line 512 form an RC network. The pre-emphasis value of the signal on line 512 can be selected by setting a resistance value of the RC network, which is a resistance value between nodes 582 and 584. Transmission gates 592, 594, and 596 respond to complementary signal pairs S2 and S2*, S4 and S4*, and S6 and S6* to selectively turn on to set the resistance value between nodes 582 and 584.

In FIG. 5, common mode voltage adjust circuit 540 includes transistor 531 and an example number of three parallel transistors 541, 543, and 545 coupled between nodes 571 and 573. The number of transistors coupled in parallel between nodes 571 and 573 can vary. The voltage at node 581 (that controls the switching of transistors 501 and 503) depends in part on a current value between nodes 571 and 573. The current value can be adjusted to adjust the voltage at node 581, thereby adjusting the switching of transistors 501 and 503 and the common mode voltage of the signal on line 511. The description below with reference to FIG. 7 describes in more detail examples of the signal on line 511 with different common mode voltages. In FIG. 5, the common mode voltages can be selected by setting a current value between nodes 571 and 573.

Transistors 541, 543, and 545 can be selectively turned on to set a current value between nodes 571 and 573, thereby setting a resistance value between nodes 571 and 573. Signals CM1, CM3, and CM5 can be used to selectively turn on transistors 541, 543, and 545. Signal $EN_1$, (e.g., enable signal) can be used to turn on transistor 531 when data is transferred on lines 511 and 512. A programmable circuit, such as programmable circuit 250 of FIG. 2, can provide signals $EN_1$ and $EN_2$, and CM1, CM2, CM3, CM4, CM5, and CM6. The current value between nodes 571 and 573 is proportional to the number of transistors 541, 543, and 545 that turn on. Transistors 541, 543, and 545, when they turn on, provide a number of parallel current paths between nodes 571 and 573. A higher of number of transistors 541, 543, and 545 turning on provides a higher current value between nodes 571 and 573. A lower number of transistors 541, 543, and 545 turning on provides a lower current value between nodes 571 and 573. The common mode voltages of the signal on line 511 depends on the current value between nodes 571 and 573. A higher current value between nodes 571 and 573 provides a higher resistance value between nodes 571 and 573, thereby providing a higher voltage on node 581. A lower current value between nodes 571 and 573 provides a lower resistance value between nodes 571 and 573, thereby providing a lower voltage on node 581.

Common mode voltage adjust circuit 540 also includes transistor 532 and an example of three parallel transistors 542, 544, and 546 coupled between nodes 574 and 573. The number of transistors coupled in parallel between nodes 574 and 573 can vary. Transistors 542, 544, and 546 perform functions to provide common mode voltage adjustments to the signal on line 512 in ways similar to the functions of transistors 541, 543, and 545 providing the common mode voltage adjustments to the signal on line 511. For example, the common mode voltage of the signal on line 512 can be adjusted by setting a current value (or resistance value) between nodes 574 and 573. Signal $EN_2$ (e.g., enable signal) can be used to turn on transistor 532 when data is transferred on lines 511 and 512. Transistors 542, 544, and 546 respond to signals CM2, CM4, and CM6 to selectively turn on and set the current value between nodes 574 and 573.

Figure 6:
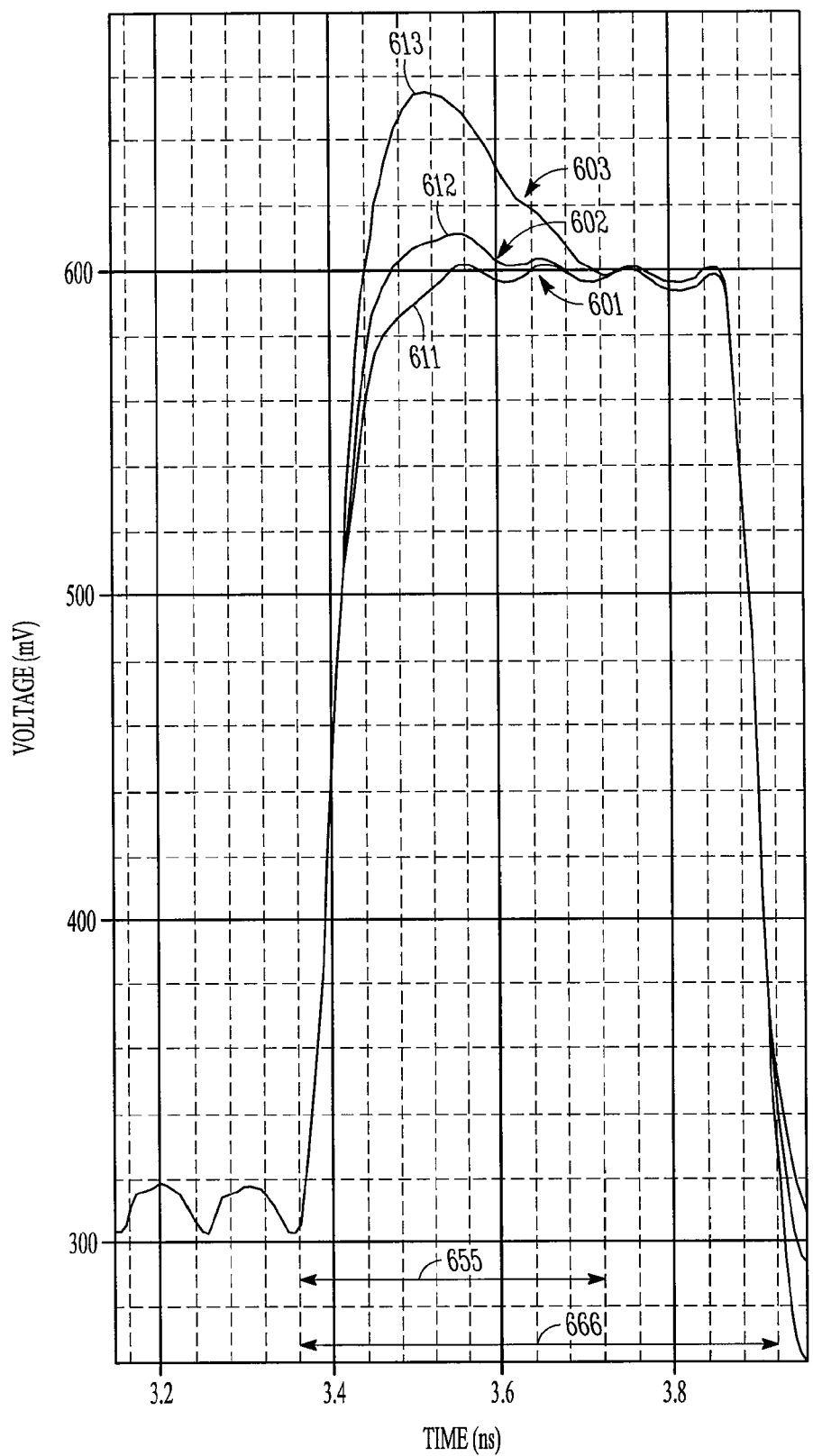
FIG. 6 is a timing diagram for the output signal control unit of FIG. 5 showing different example signals with associated pre-emphasis portions, according to an example embodiment of the invention.

FIG. 6 is a timing diagram for output signal control unit 575 of FIG. 5 showing different example signals 601, 602, and 603 with associated pre-emphasis portions 611, 612, and 613, according to an example embodiment. Pre-emphasis circuit 530 of FIG. 5 can be configured such that line 511 can have one of signals 601, 602, and 603 of FIG. 6. For example, as described above, the resistance value between nodes 581 and 583 of FIG. 5 can be selected to have different values, such as three values. The first value can be greater than the second value, and the second value can be greater than the third value. In FIG. 6, signals 601, 602, and 603 and associated pre-emphasis portions 611, 612, and 613 respectively correspond to the three different values of the resistance between nodes 581 and 583 of FIG. 5. As shown in FIG. 6, signals 601, 602, and 603 have respective pre-emphasis portions 611, 612, and 613 with different shapes and voltage values, depending on the value of the resistance between nodes 581 and 583 of FIG. 5.

The signal during time interval 666 can represent a value (e.g., logic 1) of one bit of data, such as one bit of data $D_0$, $D_1$, $D_2$, or $D_3$ during time interval 301, 302, 303, or 304 of FIG. 3. Thus, time interval 666 of FIG. 6 can correspond to time interval 301, 302, 303, or 304 of FIG. 3. Time interval 666 has a portion 655 when a pre-emphasis portion 611, 612, or 613 occurs. The duration (measured in time unit such as nanoseconds) of portion 655 is proportional to the resistance value between nodes 581 and 583. The voltage value of signal 601, 602, and 603 during portion 655 is inversely proportional to the resistance value between nodes 581 and 583 of FIG. 5.

The timing diagram of FIG. 6 can also be used as an example for signals on line 512 to represent a value (e.g., logic 1) of one bit of data, such as one bit of data $D_0^*$, $D_1^*$, $D_2^*$, or $D_3^*$. Thus, signals 601, 602, and 603 can respectively correspond to different values of the resistance between nodes 582 and 584 of FIG. 5.

Figure 7:
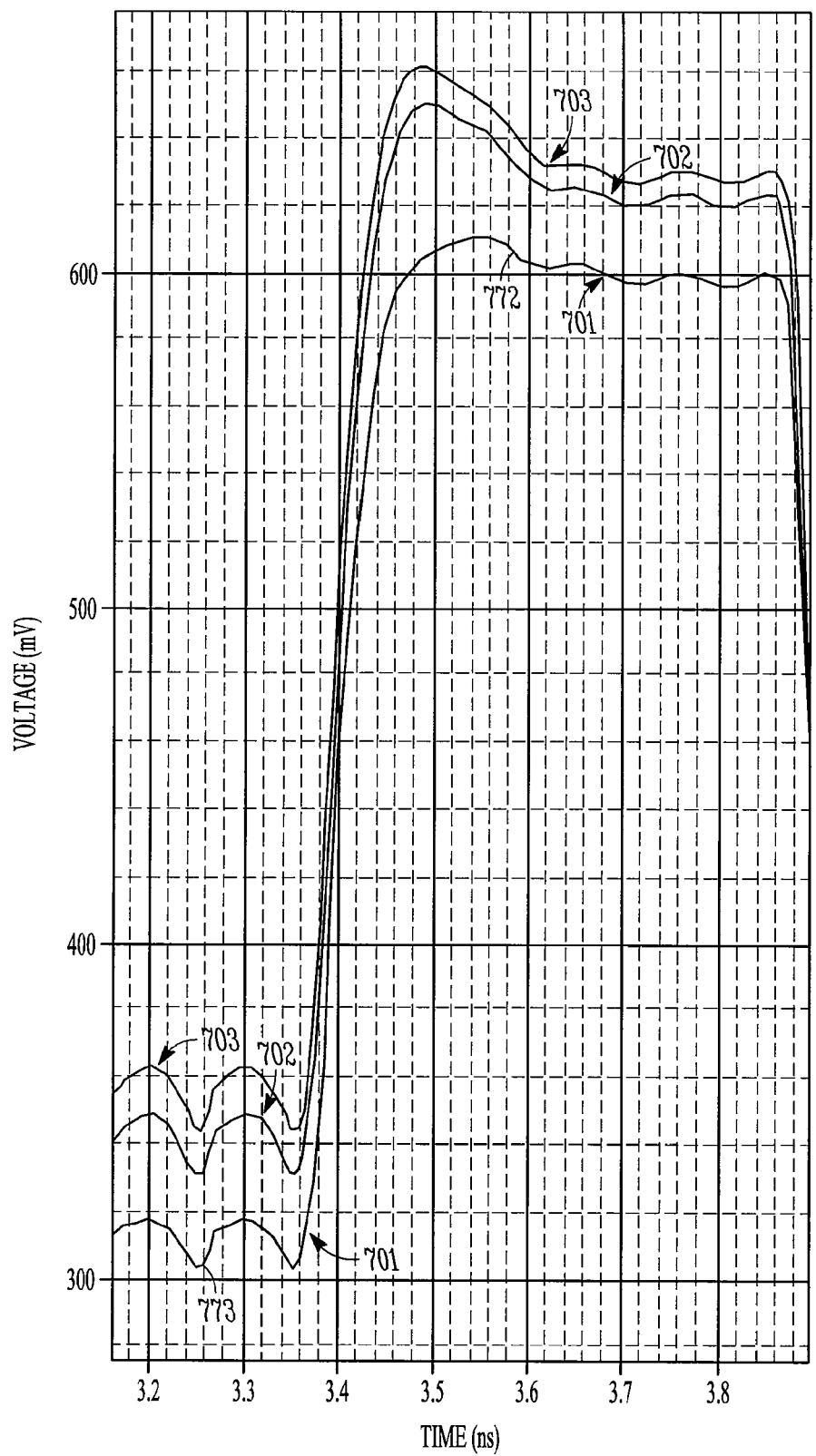
FIG. 7 is a timing diagram for the output signal control unit of FIG. 5 showing different example signals with different common mode voltage values, according to an example embodiment of the invention.

FIG. 7 is a timing diagram for output signal control unit 575 of FIG. 5 showing different example signals 701, 702, and 703 with different common mode voltage values, according to an example embodiment. Common mode voltage adjust circuit 540 of FIG. 5 can be configured such that line 511 can have one of signals 701, 702, and 703 of FIG. 7. For example, as described above, the current value (or resistance value) between nodes 571 and 573 of FIG. 5 can be selected to have different values, such as three different values. The first value can be greater than the second value, and the second value can be greater than the third value. In FIG. 7, signals 701, 702, and 703 respectively correspond to the three different first values of the resistance between nodes 571 and 573 of FIG. 5.

As shown in FIG. 7, the magnitudes of signals 701, 702, and 703 can be adjusted (e.g., move) higher or lower along the voltage axis. The magnitude of signal 701, 702, or 703 includes different voltage values representing different values of a bit of data. For example, as shown in FIG. 7, the magnitude of signal 701 includes voltage values 772 and 773. Voltage 772 can represent a first value (e.g., logic 1) of a bit of data (e.g., data D0 of FIG. 3) and voltage 773 can represent a second value (e.g., logic 0) of the bit of data. Adjusting the current value between nodes 571 and 572 of FIG. 5 can move signal 701 such that both voltages 772 and 773 can move in the same direction along the voltage axis.

The timing diagram of FIG. 7 can also be used as an example for signals of the signal on line 512 to represent a value (e.g., logic 1) of one bit of data, such as one bit of data $D_0^*$, $D_1^*$, $D_2^*$, or $D_3^*$. Thus, signals 701, 702, and 703 can respectively correspond to different current values (or different resistance values) between nodes 574 and 573 of FIG. 5.

Thus, as described above with reference to FIG. 5, FIG. 6, and FIG. 7, the value of resistance between nodes 581 and 583 of FIG. 5 can be selected such that the signal on line 511 of FIG. 5 can include one of example signals 601, 602, and 603 shown in FIG. 6 with corresponding pre-emphasis portion 611, 612, or 613. Further, independent of the selected value of the resistance between nodes 581 and 583, the current value (or resistance value) between nodes 571 and 573 of FIG. 5 can also be selected such that the magnitude of signal on line 511 can be adjusted higher or lower along the voltage axis, as shown by example signals 701, 702, and 703 of FIG. 7. Similarly, the resistance between nodes 582 and 584 of FIG. 5 and the current value (or resistance value) between nodes 574 and 573 can be independently selected such that the signal on line 512 of FIG. 5 can include one of example signals 601, 602, and 603 of FIG. 6 or one of example signals 701, 702, and 703 of FIG. 7.

In comparison to some conventional common mode logic (CML) converters (e.g., Gilbert style converter) that convert parallel data to serial data, serializer circuit 210 of FIG. 2 (which can include selector circuit 420 of FIG. 4 and output signal control unit 575 of FIG. 5) has a smaller area and consumes less power. For example, serializer circuit 210 can have approximately 70% smaller area than that of a conventional CML converter and consume approximately 72% less power than that of a conventional CML converter. Further, some conventional CML converters, such as Gilbert style converters, may have difficulty in scaling to lower operating voltages due to their structures (e.g., due to the inclusion of current mirrors in the conventional CML converters). Serializer circuit 210 of FIG. 2, however, can scale to lower operating voltages in comparison to some conventional CML converters. For example, serializer circuit 210 of FIG. 2 includes no current mirrors in selector circuits 221, 222, 223, and 224, thereby allowing it to scale to lower operating voltages.

One or more embodiments described herein include apparatus and methods having an output line, clock nodes to receive clock signals, the clock signals being out of phase with each other, and selector circuits to receive data in parallel. In at least one embodiment, the selector circuits are responsive to the clock signals to transfer the data serially to the output line. Such apparatus and methods can also include a control unit to influence a portion of a signal that represents at least a portion of the data at the output line. Other embodiments, including additional methods described above with reference to FIG. 1 through FIG. 7.

The illustrations of apparatus, such as IC device 100, serializer circuit 210, and selector circuit 420, are intended to provide a general understanding of the structure of various embodiments and not a complete description of all the elements and features of the apparatus that might make use of the structures described herein.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multichip modules. Such apparatus may further be included as sub-components within a variety of electronic systems, such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. Portions and features of some embodiments may be included in, or substituted for, those of others. Other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
   an output line;
   clock nodes to receive clock signals, wherein the clock signals are out of phase with each other;
   selector circuits to receive data in parallel, the selector circuits being responsive to the clock signals to transfer the data serially to the output line wherein one of the selector circuits includes:
   a first transistor coupled between a supply node and a circuit node, the first transistor having a gate to receive a first clock signal of the clock signals;
   a second transistor coupled in series with the first transistor between the supply node and the circuit node, the second transistor having a gate to receive a second clock signal of the clock signals, wherein the first and second clock signals have a phase difference;
   a third transistor coupled between the circuit node and a second supply node, the third transistor having a gate to receive the second clock signal; and
   a fourth transistor coupled in parallel with the third transistor between the circuit node and the second supply node, the fourth transistor having a gate to receive the first clock signal; and
   a control unit to influence at least a portion of a data at the output line.

2. The apparatus of claim 1, wherein each of the selector circuits is configured to respond to a different combination of the clock signals to transfer a different portion of the data to the output line, wherein the different combinations of the clock signals include clock signals having 90 degrees phase difference.

3. The apparatus of claim 1, wherein the selector circuits includes a first selector circuit to transfer a first data of the data to the output line, the first selector circuit configured to electrically couple the output line to a supply node through a circuit path during a time interval when the first data is transferred to the output line.

4. The apparatus of claim 3, wherein the first selector circuit is configured to electrically couple the output line to the supply node if the first data has a first value, and the first selector circuit is configured to electrically couple the output line to another supply node during the time interval if the first data has a second value.

5. The apparatus of claim 3, wherein the unit is configured to electrically couple the output line to the supply node through an additional circuit path during a portion of the time interval.

6. The apparatus of claim 5, wherein the unit includes selectable current paths configured to adjust a first voltage value of the signal corresponding to a first value of the first data and to adjust a second voltage value of the signal corresponding to a second value of the first data.

7. The apparatus of claim 5, wherein the unit is configured to electrically decouple the output line from the supply node to disable the additional circuit path during another portion of the time interval.

8. An apparatus comprising:
   an output line;
   clock nodes to receive clock signals, wherein the clock signals are out of phase with each other;
   selector circuits to receive data in parallel, the selector circuits being responsive to the clock signals to transfer the data serially to the output line, wherein the selector circuits includes a first selector circuit to transfer a first data of the data to the output line, the first selector circuit configured to electrically couple the output line to a supply node through a circuit path during a time interval when the first data is transferred to the output line; and
   a control unit to influence at least a portion of a data at the output line, wherein the unit is configured to electrically couple the output line to the supply node through an additional circuit path during a portion of the time interval, and wherein the unit includes an RC network to set a duration for the portion of the time interval.

9. The apparatus of claim 8, wherein the unit further includes a programmable circuit to set a resistance value of the RC network.

10. An apparatus comprising:
    an output line;

clock nodes to receive four clock signals, the four clock signals having phase differences;
a first selector circuit including a first input node to receive a first data, the first selector circuit being responsive to a first combination of the four clock signals to transfer the first data to the output line;
a second selector circuit including a second input node to receive a second data, the second selector circuit being responsive to a second combination of the four clock signals to transfer the second data to the output line;
a third selector circuit including a third input node to receive a third data, the third selector circuit being responsive to a third combination of the four clock signals to transfer the third data to the output line;
a fourth selector circuit including a fourth input node to receive a fourth data, the fourth selector circuit being responsive to a fourth combination of the four clock signals to transfer the fourth data to the output line; and
a control unit to influence a portion of a signal that represents at least one of the first data, the second data, the third data, and the fourth data at the output line, wherein the control unit includes an inverter having an inverter output node coupled to the output line, and at least one transistor coupled in parallel between an inverter input node of the inverter and the output line.

11. The apparatus of claim 10 further comprising an additional output line, wherein:
the first selector circuit further includes a fifth input node to receive a complement of the first data, the first selector circuit being responsive to the first combination of the four clock signals to transfer the complement of the first data to the additional output line;
the second selector circuit further includes a sixth input node to receive a complement of the second data, the second selector circuit being responsive to the second combination of the four clock signals to transfer the complement of the second data to the additional output line;
a third selector circuit including a seventh input node to receive a complement of the third data, the third selector circuit being responsive to the third combination of the four clock signals to transfer the complement of the third data to the additional output line; and
a fourth selector circuit including an eighth input node to receive a complement of the fourth data, the fourth selector circuit being responsive to the fourth combination of the four clock signals to transfer the complement of the fourth data to the additional output line.

12. The apparatus of claim 10, wherein the phase differences include a first phase difference of 90 degrees between a first clock signal and a second clock signal of the four clock signals, a second phase difference of 90 degrees between the second clock signal and a third clock signal of the four clock signals, a third phase difference of 90 degrees between the third clock signal and a fourth clock signal of the four clock signals, and a fourth phase difference of 90 degrees between the fourth and first clock signals.

13. An apparatus comprising:
an output line;
clock nodes to receive four clock signals, the four clock signals having phase differences;
a first selector circuit including a first input node to receive a first data, the first selector circuit being responsive to a first combination of the four clock signals to transfer the first data to the output line, wherein the first selector circuit includes:

a first transistor coupled between a supply node and a circuit node, the first transistor having a gate to receive a first clock signal of the four clock signals;
a second transistor coupled in series with the first transistor between the supply node and the circuit node, the second transistor having a gate to receive a second clock signal of the four clock signals, wherein the first and second clock signals have a phase difference of 90 degrees;
a third transistor coupled between the circuit node and a second supply node, the third transistor having a gate to receive the second clock signal; and
a fourth transistor coupled in parallel with the third transistor between the circuit node and the second supply node, the fourth transistor having a gate to receive the first clock signal;
a second selector circuit including a second input node to receive a second data, the second selector circuit being responsive to a second combination of the four clock signals to transfer the second data to the output line;
a third selector circuit including a third input node to receive a third data, the third selector circuit being responsive to a third combination of the four clock signals to transfer the third data to the output line;
a fourth selector circuit including a fourth input node to receive a fourth data, the fourth selector circuit being responsive to a fourth combination of the four clock signals to transfer the fourth data to the output line; and
a control unit to influence a portion of a signal that represents at least one of the first data, the second data, the third data, and the fourth data at the output line.

14. The apparatus of claim 13, wherein the first selector circuit further includes:
an inverter having an inverter input node to receive the first data; and
a fifth transistor having a gate coupled to the circuit node, a source coupled to the output line, and a drain coupled to an output node of the inverter.

15. The apparatus of claim 14 further comprising an additional output line, wherein the first selector circuit further includes a second input node to receive a complement of the first data, the first selector circuit being responsive to the first combination of the four clock signals to transfer the complement of the first data to the additional output line, the first selector circuit further including:
an additional inverter having an additional input node to receive the complement of the first data; and
a sixth transistor having a gate coupled to the circuit node, a source coupled to the additional output line, and a drain coupled to an output node of the additional inverter.

16. An apparatus comprising:
an output line;
clock nodes to receive four clock signals, the four clock signals having phase differences;
a first selector circuit including a first input node to receive a first data, the first selector circuit being responsive to a first combination of the four clock signals to transfer the first data to the output line;
a second selector circuit including a second input node to receive a second data, the second selector circuit being responsive to a second combination of the four clock signals to transfer the second data to the output line;
a third selector circuit including a third input node to receive a third data, the third selector circuit being responsive to a third combination of the four clock signals to transfer the third data to the output line;

a fourth selector circuit including a fourth input node to receive a fourth data, the fourth selector circuit being responsive to a fourth combination of the four clock signals to transfer the fourth data to the output line; and a control unit to influence a portion of a signal that represents at least one of the first data, the second data, the third data, and the fourth data at the output line, wherein the control unit includes:

an inverter having an inverter output node coupled to the output line; and first transistors coupled in parallel between an inverter input node of the inverter and the output line.

17. The apparatus of claim 16, wherein the first transistors are configured to receive signals to selectively set a resistance value between the inverter input node and the output line.

18. The apparatus of claim 16 further comprising selectable current paths coupled in parallel between the inverter input node and a supply node.

19. The apparatus of claim 18, wherein the current paths include transistors configured to receive signals to selectively set a value of a current between the inverter input node and the supply node.

20. The apparatus of claim 16 further comprising an additional output line, and wherein the control unit further includes:

an additional inverter having an inverter output node coupled to the additional output line; and second transistors coupled between an inverter input node of the additional inverter and the additional output line.

21. The apparatus of claim 20 further comprising:

third transistors coupled in parallel between the inverter input node of the inverter and a supply node; and fourth transistors coupled in parallel between the inverter input node of the additional inverter and the supply node.

22. A method comprising:

receiving data in parallel;

serially transferring the data to an output line responsive to four clock signals, wherein the clock signal are out of phase with each;

electrically coupling the output line to a supply node through a first circuit path during a portion of a time interval when at least a portion of the data is transferred on the output line;

electrically coupling the output line to the supply node through a second circuit path during the portion of the time interval; and controlling a portion of a signal that represents the portion of the data, wherein controlling is performed by a control unit that includes an inverter having an inverter output node coupled to the output line, and at least one transistors coupled in parallel between an inverter input node of the inverter and the output line.

23. The method of claim 22 further comprising:

disabling the second circuit path during another portion of the time interval.

24. The method of claim 22, wherein serially transferring the data includes:

transferring a first bit of the data to the output line when a first clock signal and a second clock signal of the four clock signals have a same level;

transferring a second bit of the data to the output line when the second clock signal and a third clock signal of the four clock signals have a same value;

transferring a third bit of the data to the output line when the third clock signal and a fourth clock signal of the four clock signals have a same level; and transferring a four bit of the data to the output line when the fourth clock signal and the first clock signal have a same level.

25. The method of claim 24, wherein the first, second, third, and fourth bits are transferred to the output line in a time equal to one clock period of one of the first, second, third, and fourth clock signals.

* * * * *